United States Patent
Wu et al.

(10) Patent No.: US 12,068,155 B2
(45) Date of Patent: Aug. 20, 2024

(54) ANISOTROPIC SIGE:B EPITAXIAL FILM GROWTH FOR GATE ALL AROUND TRANSISTOR

(71) Applicant: Applied Materials, Inc., Santa Clara, CA (US)

(72) Inventors: Chen-Ying Wu, Santa Clara, CA (US); Zhiyuan Ye, San Jose, CA (US); Xuebin Li, Sunnyvale, CA (US); Sathya Chary, San Francisco, CA (US); Yi-Chiau Huang, Fremont, CA (US); Saurabh Chopra, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 205 days.

(21) Appl. No.: 17/396,371

(22) Filed: Aug. 6, 2021

(65) Prior Publication Data
US 2023/0037320 A1    Feb. 9, 2023

(51) Int. Cl.
| | | |
|---|---|---|
| H01L 21/02 | (2006.01) | |
| H01L 29/08 | (2006.01) | |
| H01L 29/423 | (2006.01) | |
| H01L 29/66 | (2006.01) | |
| H01L 29/04 | (2006.01) | |

(52) U.S. Cl.
CPC .... *H01L 21/02211* (2013.01); *H01L 29/0847* (2013.01); *H01L 29/42392* (2013.01); *H01L 29/66439* (2013.01); *H01L 29/66742* (2013.01); *H01L 29/04* (2013.01)

(58) Field of Classification Search
CPC ................................................. H01L 21/02211
USPC ........................................................ 438/481
See application file for complete search history.

(56) References Cited

U.S. PATENT DOCUMENTS

| 7,435,665 B2 | 10/2008 | Airaksinen et al. |
| 10,002,759 B2 | 6/2018 | Bao et al. |
| 10,177,227 B1 | 1/2019 | Yoshida et al. |

(Continued)

FOREIGN PATENT DOCUMENTS

| TW | 201913765 A | 4/2019 |
| WO | 2022/164566 A1 | 8/2022 |

OTHER PUBLICATIONS

Sangmo Koo et al., Selective epitaxial growth of stepwise SiGe:B at the recessed sources and drains: A growth kinetics and strain distribution study, Sep. 19, 2016, AIP Advances 6, 095114.

(Continued)

*Primary Examiner* — Ajay Arora
(74) *Attorney, Agent, or Firm* — Patterson + Sheridan, LLP

(57) ABSTRACT

Embodiments described herein relate to a method of epitaxial deposition of p-channel metal oxide semiconductor (MMOS) source/drain regions within horizontal gate all around (hGAA) device structures. Combinations of precursors are described herein, which grow of the source/drain regions on predominantly <100> surfaces with reduced or negligible growth on <110> surfaces. Therefore, growth of the source/drain regions is predominantly located on the top surface of a substrate instead of the alternating layers of the hGAA structure. The precursor combinations include a silicon containing precursor, a germanium containing precursor, and a boron containing precursor. At least one of the precursors further includes chlorine.

20 Claims, 9 Drawing Sheets

| COMBINATION # | Si | | Ge | | B | | HYDROGEN CHLORIDE (HCl) |
|---|---|---|---|---|---|---|---|
| | DICHLOROSILANE ($SiH_2Cl_2$) | SILANE ($SiH_4$) | GERMANE ($GeH_4$) | ($GeCl_4$) GERMANIUM TETRACHLORIDE | DIBORANE ($B_2H_6$) | ($BCl_3$) BORON TRICHLORIDE | |
| 1 | ✓ | | ✓ | | ✓ | ✓ | |
| 2 | | ✓ | ✓ | | ✓ | ✓ | |
| 3 | | ✓ | | ✓ | ✓ | | |
| 4 | | ✓ | ✓ | ✓ | | ✓ | |
| 5 | | ✓ | ✓ | ✓ | ✓ | ✓ | |
| 6 | ✓ | | | ✓ | ✓ | ✓ | |
| 7 | | ✓ | | ✓ | | ✓ | |
| 8 | | ✓ | ✓ | | ✓ | ✓ | ✓ |

(56) References Cited

U.S. PATENT DOCUMENTS

| | | | |
|---|---|---|---|
| 10,205,002 B2 | 2/2019 | Bao et al. | |
| 2015/0318364 A1 | 11/2015 | Cai | |
| 2017/0194430 A1* | 7/2017 | Wood | H01L 29/0673 |
| 2019/0109004 A1 | 4/2019 | Huang et al. | |
| 2019/0122937 A1 | 4/2019 | Cheng et al. | |
| 2020/0105932 A1* | 4/2020 | Li | H01L 21/823814 |
| 2021/0028280 A1 | 1/2021 | Liu et al. | |
| 2021/0057539 A1 | 2/2021 | Chiang et al. | |
| 2021/0126135 A1 | 4/2021 | Lee et al. | |
| 2022/0238650 A1 | 7/2022 | Wu et al. | |
| 2022/0278198 A1* | 9/2022 | Lee | H01L 29/78696 |

OTHER PUBLICATIONS

International Search Report and Written Opinion for International Application No. PCT/US2022/036138 dated Nov. 7, 2022, whole document.

Taiwan Intellectual Property Office Non-Final Office Action dated Sep. 7, 2023 with Search Report for Patent Application No. TW 111125885.

Office Action for Taiwan Application No. 111125885 dated May 8, 2024.

\* cited by examiner

| COMBINATION # | Si | | Ge | | B | | |
|---|---|---|---|---|---|---|---|
| | DICHLOROSILANE (SiH$_2$Cl$_2$) | SILANE (SiH$_4$) | GERMANE (GeH$_4$) | (GeCl$_4$) GERMANIUM TETRACHLORIDE | DIBORANE (B$_2$H$_6$) | (BCl$_3$) BORON TRICHLORIDE | HYDROGEN CHLORIDE (HCl) |
| 1 | ✓ | | ✓ | | ✓ | ✓ | |
| 2 | | ✓ | ✓ | | ✓ | ✓ | |
| 3 | | ✓ | | ✓ | ✓ | | |
| 4 | | ✓ | ✓ | ✓ | | ✓ | |
| 5 | | ✓ | ✓ | ✓ | ✓ | ✓ | |
| 6 | ✓ | | | ✓ | ✓ | ✓ | |
| 7 | | ✓ | | ✓ | | ✓ | |
| 8 | | ✓ | ✓ | | ✓ | ✓ | ✓ |

FIG. 5

ANISOTROPIC SIGE:B EPITAXIAL FILM GROWTH FOR GATE ALL AROUND TRANSISTOR

BACKGROUND

Field

Embodiments of the present disclosure generally relate to a method for forming a semiconductor device. More specifically, the application relates to epitaxial deposition methods for horizontal gate all around (hGAA) device structures.

Description of the Related Art

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate-all-around (hGAA) structure. The hGAA device structure includes several lattice-matched channels suspended in a stacked configuration and connected by source/drain regions.

Current methods of forming source/drain regions adjacent hGAA structures have poor wetting on non-crystalline sidewalls and dielectric materials. Growth of the source/drain regions on both <110> and <100> surfaces simultaneously has been shown to be problematic in that voids or openings are formed within the source/drain regions adjacent the non-crystalline or dielectric materials layers of the hGAA structure. Voids or openings may also be formed in other locations within the source/drain regions due to uneven film growth and a plurality of intersecting growth boundaries within the source/drain regions. Faceting of the source/drain region during deposition is also seen and can reduce effectiveness of devices when the source/drain region is not formed adjacent to and in contact with any one or more of the non-crystalline layers, the crystalline layers, or the dielectric material layers.

Therefore, there is a need for a method of forming source/drain regions within hGAA structures with improved wetting, reduced faceting, and controlled growth directions.

SUMMARY

The present disclosure generally relates to the selective deposition of source/drain layers within a semiconductor device. In one embodiment, a method of forming a semiconductor device includes forming a multi-material layer on a substrate, exposing the substrate and the multi-material layer to a gas mixture, and forming a source/drain layer on the substrate with predominantly <100> growth. The multi-material layer includes a plurality of crystalline first layers and a plurality of non-crystalline second layers arranged in an alternating pattern. The gas mixture includes a first precursor containing silicon, a second precursor containing germanium, and a third precursor containing a p-type dopant. At least one of the first precursor, the second precursor, or the third precursor further includes chlorine.

In another embodiment, a method of forming a semiconductor device includes selectively growing a source region and a drain region on a substrate in a predominantly <100> direction. The selectively growing the source and the drain regions further includes exposing the substrate and the multi-material layer to a gas mixture containing silane, a second precursor containing germanium, and a p-type dopant containing precursor, wherein one or more of the second precursor or the p-type dopant containing precursor further includes chlorine.

In another embodiment, a non-transitory computer-readable medium storing instructions is described. When the instructions are executed by a processor, the instructions cause a computer system to perform the steps of exposing a substrate and a multi-material layer to a gas mixture and forming a source/drain layer on the substrate with predominantly <100> growth. The gas mixture includes a first precursor containing silicon, a second precursor containing germanium, and a third precursor containing a p-type dopant, wherein one or more of the first precursor, the second precursor, and the third precursor further includes chlorine.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 5 is a chart illustrating different combinations of precursors used within the method of FIG. 4.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to a method for forming a semiconductor device. Methods of epitaxial deposition of p-channel metal oxide semiconductor (PMOS) source/drain regions within horizontal gate all around (hGAA) device structures are provided. The methods described herein utilize precursor combinations and dopants which have been shown to exhibit improved source/drain film growth. More specifically, the methods described herein have been shown to illustrate reduced faceting, improved wetting with layers within the hGAA structure, and reduced void formation.

The improved results are at least partially enabled by the growth of the source/drain regions on predominantly <100> surfaces. The growth rate is reduced or zero on <110> surfaces, such that growth of the source/drain regions is predominantly located on the top surface of a substrate instead of the alternating layers of the hGAA structure. Predominant growth along one surface instead of on the alternating layers has been shown to greatly decrease the number of voids formed within the source/drain regions as the number of growth boundary layers are reduced.

The precursors and precursor ratios described herein have been found to exhibit reduced or negligible film growth along the <110> surfaces while additionally having improved wetting capabilities and reduced faceting. In some embodiments the growth rate along <100> surfaces is more than 5 times the growth rate along <110> surfaces, such as greater than 10 times the growth rate along <110> surfaces.

Figure 1:
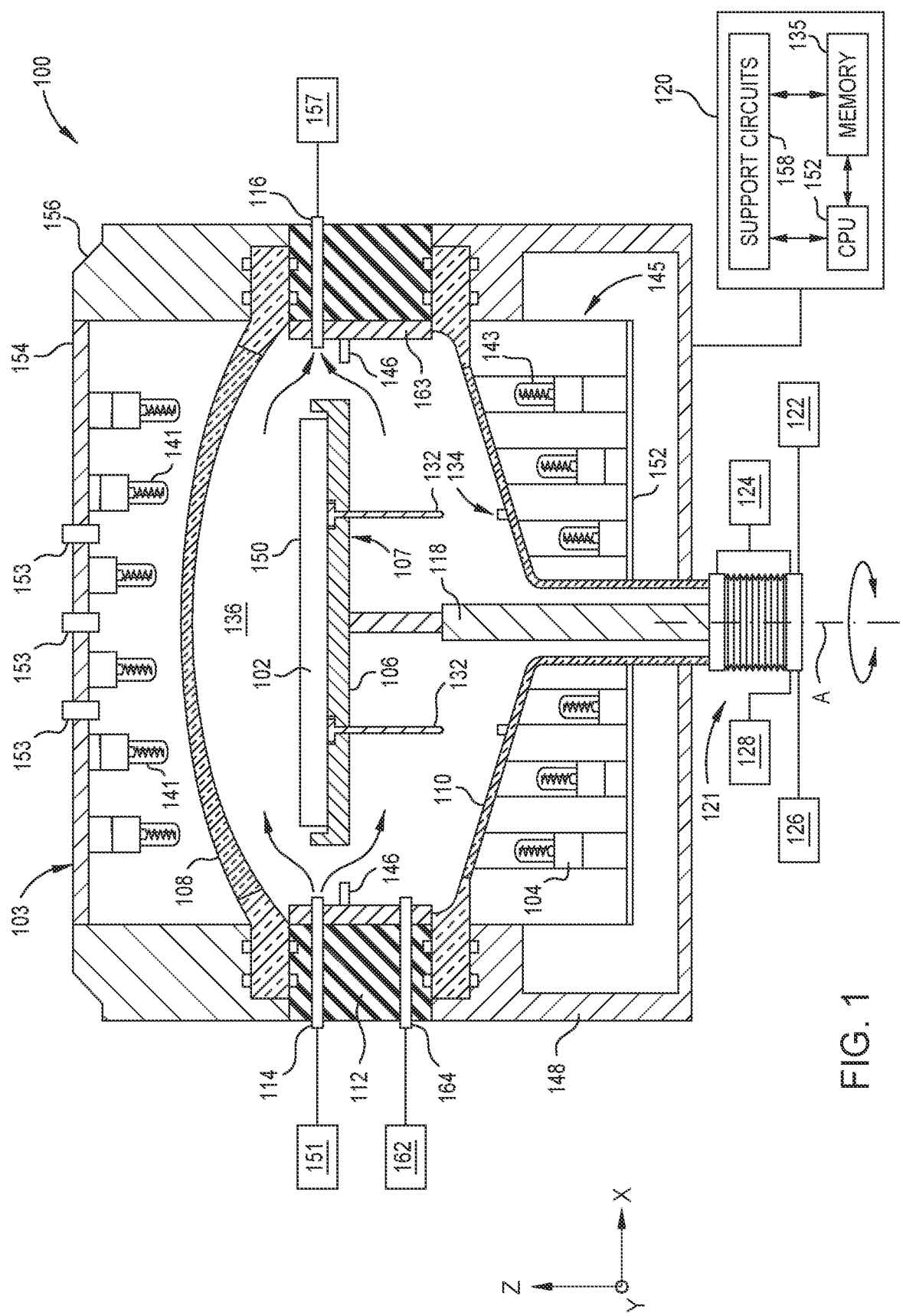
FIG. 1 is a schematic illustration of a type of deposition chamber, according to one embodiment of the disclosure.

FIG. 1 is a schematic illustration of a type of deposition chamber 100 according to one embodiment of the present disclosure. The deposition chamber 100 is utilized to grow an epitaxial film on a substrate, such as the substrate 102. The deposition chamber 100 creates a cross-flow of precursors across the top surface 150 of the substrate 102.

The deposition chamber 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper dome 108, a lower dome 110, a plurality of upper lamps 141, and a plurality of lower lamps 143. As shown, a controller 120 is in communication with the deposition chamber 100 and is used to control processes, such as those described herein. The substrate support 106 is disposed between the upper dome 108 and the lower dome 110. The plurality of upper lamps 141 are disposed between the upper dome 108 and a lid 154. The lid 154 includes a plurality of sensors 153 disposed therein for measuring the temperature within the deposition chamber 100. The plurality of lower lamps 143 are disposed between the lower dome 110 and a floor 152. The plurality of lower lamps 143 form a lower lamp assembly 145.

A processing volume 136 is formed between the upper dome 108 and the lower dome 110. The processing volume 136 has the substrate support 106 disposed therein. The substrate support 106 includes a top surface on which the substrate 102 is disposed. The substrate support 106 is attached to a shaft 118. The shaft is connected to a motion assembly 121. The motion assembly 121 includes one or more actuators and/or adjustment devices that provide movement and/or adjustment of the shaft 118 and/or the substrate support 106 within the processing volume 136. The motion assembly 121 includes a rotary actuator 122 that rotates the shaft 118 and/or the substrate support 106 about a longitudinal axis A of the deposition chamber 100. The motion assembly 121 further includes a vertical actuator 124 to lift and lower the substrate support 106 in the z-direction. The motion assembly includes a tilt adjustment device 126 that is used to adjust the planar orientation of the substrate support 106 and a lateral adjustment device 128 that is used to adjust the position of the shaft 118 and the substrate support 106 side to side within the processing volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a processing position to a transfer position.

The flow module 112 includes a plurality of process gas inlets 114, a plurality of purge gas inlets 164, and one or more exhaust gas outlets 116. The plurality of process gas inlets 114 and the plurality of purge gas inlets 164 are disposed on the opposite side of the flow module 112 from the one or more exhaust gas outlets 116. One or more flow guides 146 are disposed below the plurality of process gas inlets 114 and the one or more exhaust gas outlets 116. The flow guide 146 is disposed above the purge gas inlets 164. A liner 163 is disposed on the inner surface of the flow module 112 and protects the flow module 112 from reactive gases used during deposition processes. The process gas inlets 114 and the purge gas inlets 164 are positioned to flow a gas parallel to the top surface 150 of the substrate 102 disposed within the processing volume 136. The process gas inlets 114 are fluidly connected to a process gas source 151. The purge gas inlets 164 are fluidly connected to a purge gas source 162. The one or more exhaust gas outlets 116 are fluidly connected to an exhaust pump 157. Each of the process gas source 151 and the purge gas source 162 may be configured to supply one or more precursors or process gases into the processing volume 136.

Figure 2:
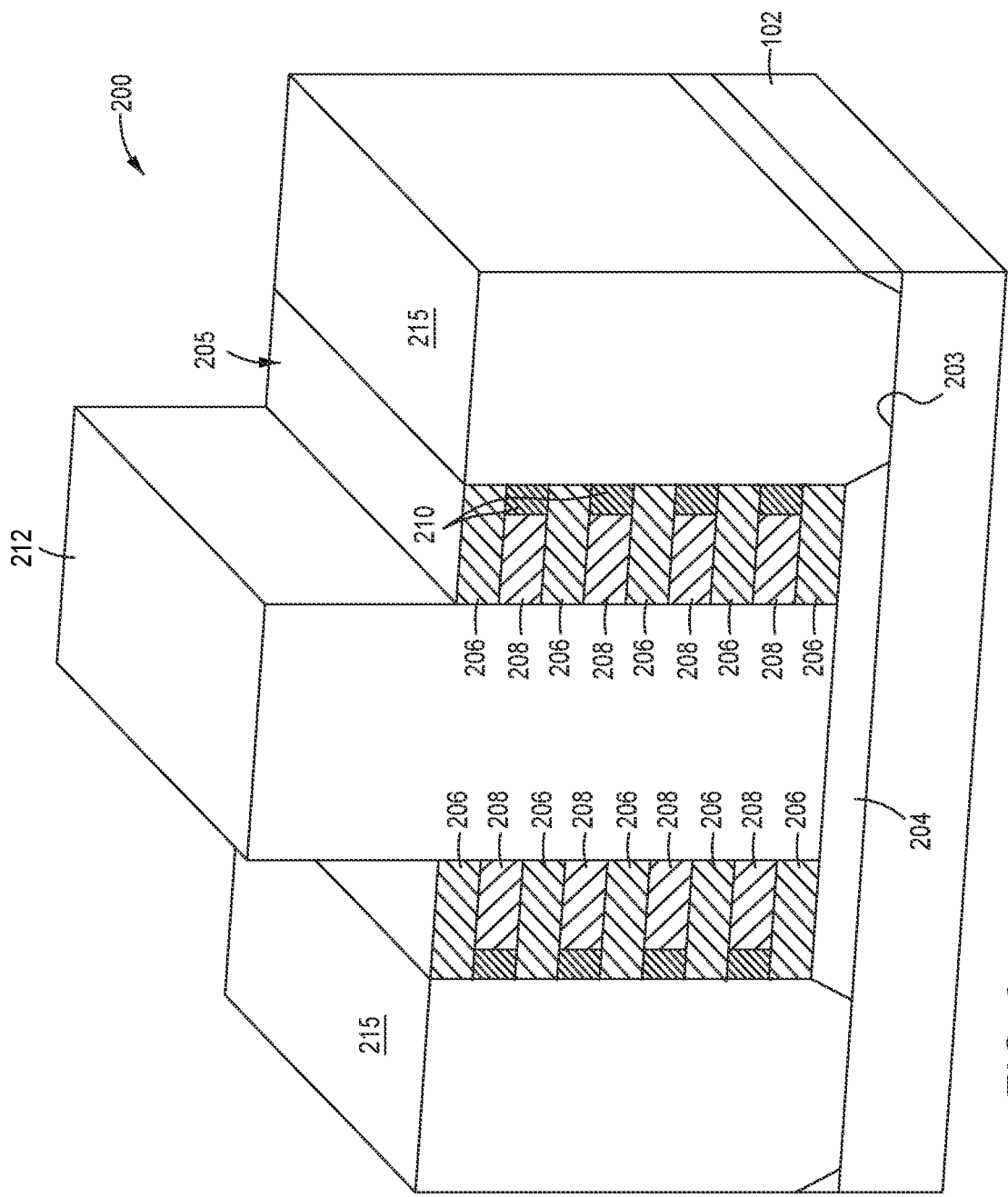
FIG. 2 is a schematic isometric view of an hGAA structure, according to one embodiment of the disclosure.

FIG. 2 illustrates a schematic isometric view of a horizontal gate-all around (hGAA) structure 200, according to one embodiment. The hGAA structure 200 includes a multi-material layer 205 having alternating first layers 206 and second layers 208 with a spacer 210 formed therein. The hGAA structure 200 utilizes the multi-material layer 205 as nanowires or nanosheets (e.g., channels) between source/drain layers 215 and a gate structure 212. As shown in the cross-sectional view of the multi-material layer 205 in FIGS. 3A-3E, the nanowire spacer 210 formed at the bottom (e.g., or an end) of each of the second layers 208 assists in managing the interface between the second layers 208 and the source/drain layers 215 so as to reduce parasitic capacitance and maintain minimum device leakage.

The hGAA structure 200 includes the multi-material layer 205 disposed on a top surface 203 of the substrate 102, such as on top of an optional material layer 204 disposed on the substrate 102. In the embodiments in which the optional material layer 204 is not present, the multi-material layer 205 is directly formed on the substrate 102. In some embodiments, the optional material layer 204 is only formed beneath the multi-material layer 205 and does not cover the entire top surface 203 of the substrate 102. In some embodiments, the optional material layer 204 does cover the entire top surface 203 of the substrate 102 and the source/drain layers 215 as well as the multi-material layer 205 are formed on top of the optional material layer 204.

The substrate 102 may be a material such as crystalline silicon (e.g., Si<100>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 102 may have various dimensions, such as 200 mm, 300 mm, 450 mm, or other diameter, as well as, being a rectangular or square panel. Unless otherwise noted, examples described herein are conducted on substrates with a 200 mm diameter, a 300 mm diameter, or a 450 mm diameter substrate.

In one example, the optional material layer 204 is an insulating material. Suitable examples of the insulating material may include silicon oxide material, silicon nitride material, silicon oxynitride material, or any suitable insulating materials. Alternatively, the optional material layer 204 may include conductive material or non-conductive material as needed. The multi-material layer 205 includes at least one pair of layers, each pair comprising the first layer 206 and the second layer 208. Although the example depicted in FIG. 2 shows four pairs and a first layer 206 cap, each pair includes the first layer 206 and the second layer 208 (alternating pairs, each pair comprising the first layer 206 and the second layer 208). An additional first layer 206 is disposed as the top of the multi-material layer 205. The number of pairs may be varied based on different process needs with extra or without extra first layers 206 or second layers 208. In one implementation, the thickness of each single first layer 206 may be between about 20 Å and about 200 Å, such as about 50 Å, and the thickness of the each single second layer 208 may be between about 20 Å and about 200 Å, such as about 50 Å. The multi-material layer 205 may have a total thickness between about 10 Å and about 5000 Å, such as between about 40 Å and about 4000 Å.

Each of the first layers 206 is a crystalline layer, such as a single crystalline, polycrystalline, or monocrystalline silicon layer. The first layers 206 are formed using an epitaxial deposition process. Alternatively, the first layers 206 are doped silicon layers, including p-type doped silicon layers or n-type doped layers. Suitable p-type dopants includes B dopants, Al dopants, Ga dopants, In dopants, or the like. Suitable n-type dopant includes N dopants, P dopants, As dopants, Sb dopants, or the like. In yet another example, the first layers 206 are a group III-V material, such as a GaAs layer.

The second layers 208 are non-crystalline material layers, such as amorphous or polysilicon layers. In some embodiments, the second layers 208 are Ge containing layers, such as SiGe layers, Ge layers, or other suitable layers. Alternatively, the second layers 208 are doped silicon layers, including p-type doped silicon layers or n-type doped layers. In yet another example, the second layers 208 are group III-V materials, such as a GaAs layer. In still another example, the first layers 206 are silicon layers and the second layers 208 are a metal material having a high-k material coating (not shown) on lateral outer surfaces of the metal material. The high-k material coating is disposed between the second layers 208 and the spacers 210. Suitable examples of the high-k material includes hafnium dioxide (HfO2), zirconium dioxide (ZrO2), hafnium silicate oxide (HfSiO4), hafnium aluminum oxide (HfAlO), zirconium silicate oxide (ZrSiO4), tantalum dioxide (TaO2), aluminum oxide, aluminum doped hafnium dioxide, bismuth strontium titanium (BST), or platinum zirconium titanium (PZT), among others. In one particular implementation the coating layer is a hafnium dioxide (HfO2) layer. In some embodiments, the second layers 208 are a similar material to the gate structure 212 to form a wraparound gate around the first layers 206.

Each of the spacers 210 are formed adjacent to the ends of the second layers 208 and may be considered a portion of the second layers 208. The spacers 210 are dielectric spacers or air gaps. The spacers 210 may be formed by etching away a portion of each of the second layers 208 using an etching precursor to form a recess at the ends of each of the second layers 208. The spacers 210 are formed in the recesses adjacent each of the second layers 208. A liner layer (not shown) may additionally be deposited within the recesses before the deposition of the spacers 210. The spacers 210 are formed from a dielectric material and separate each of the nanowires or nanosheets formed as the first layers 206. In some embodiments the spacers 210 are selected to be a silicon containing material that may reduce parasitic capacitance between the gate and source/drain structure in the hGAA nanowire structure, such as a low-K material. The silicon containing material or the low-K material may be silicon nitride, silicon oxide, silicon oxynitride, silicon carbide, silicon oxycarbide, silicon carbide nitride, doped silicon layer, or other suitable materials, such as Black Diamond® material available from Applied Materials.

In one embodiment, the spacers 210 are a low-k material (e.g., dielectric constant less than 4), such as silicon oxycarbonitride (SiOCN) or another silicon oxide/silicon nitride/silicon carbide containing material. In yet other embodiments, the spacers 210 are air gaps.

The gate structure 212 is disposed over and around the multi-material layer 205. The gate structure 212 includes a gate electrode layer (not shown) and may additionally include a gate dielectric layer, gate spacers, and a mask layer, according to one embodiment. The gate electrode layer of the gate structure 212 includes a polysilicon layer or a metal layer that is capped with a polysilicon layer. The gate electrode layer can include metal nitrides (such as titanium nitride (TiN), tantalum nitride (TaN) or molybdenum nitride ($MoN_x$)), metal carbides (such as tantalum carbide (TaC) or hafnium carbide (HfC)), metal-nitride-carbides (such as TaCN), metal oxides (such as molybdenum oxide ($MoO_x$)), metal oxynitrides (such as molybdenum oxynitride ($MoO_xN_y$)), metal silicides (such as nickel silicide), or combinations thereof. The gate electrode layer is disposed on top of and around the multi-material layer 205.

A gate dielectric layer may optionally be disposed below the gate electrode layer and below the multi-material layer 205. The optional gate dielectric layer can include silicon oxide ($SiO_x$), which can be formed by a thermal oxidation of one or more of the first layers 206 or and/or the second layers 208, or by any suitable deposition process. Suitable materials for forming the gate dielectric layer include silicon oxide, silicon nitrides, oxynitrides, metal oxides such as hafnium oxide ($HfO_2$), hafnium zirconium oxide ($HfZrO_x$), hafnium silicon oxide ($HfSiO_x$), hafnium titanium oxide ($HfTiO_x$), hafnium aluminum oxide ($HfAlO_x$), and combinations and multi-layers thereof. Gate spacers are formed on sidewalls of the gate electrode layer. Each gate spacer includes a nitride portion and/or an oxide portion. A mask layer is formed on top of the gate electrode layer and can include silicon nitride.

The source/drain layers 215 are formed on either side of the multi-material layer 205. The source/drain layers 215 are grown from the top surface 203 of the substrate 102. In embodiments described herein, the source/drain layers 215 are formed during an epitaxial deposition process. The source/drain layers 215 are formed of a silicon-germanium material with one or more n-type or p-type dopants disposed therein. In embodiments described herein, the source/drain layers 215 include a silicon-germanium material with a boron dopant. The concentration of the boron dopant and the ratio of silicon to germanium is controlled to improve wetting with the multi-material layer 205, reduce faceting, and increase the relative growth rate of the source/drain layers 215 on the top surface 203 of the substrate 102 when compared to the growth rate of the source/drain layers 215 on portions of the multi-material layer 205. Specific precursor combinations disclosed herein have been shown to exhibit highly selective growth on the top surface 203 of the substrate 102, the substrate 102 having a <100> crystal growth direction, and reduced or negligible growth on the sidewalls of the multi-material layer 205.

FIGS. 3A-3E illustrate schematic cross-sectional views of the hGAA structure 200 of FIG. 2 during formation of the source/drain layers 215. The hGAA structure 200 includes one or more multi-material layers 205 disposed on different portions of the substrate 102. FIGS. 3A-3E illustrate two adjacent multi-material layers 205 on the substrate 102. Each of the multi-material layers 205 may be formed using similar or different methods. The multi-material layers 205 are formed on the substrate before the deposition of the source/drain layers 215 during an operation 402. The operation 402 may comprise multiple deposition and etch operations and may be performed within a plurality of separate process chambers. The operation 402 is part of the overall method 400 of forming the source/drain layers 215 within the hGAA structure 200.

As described herein, there are openings 302 disposed between each of the adjacent multi-material layers 205. Each of the openings 302 are formed by the top surface 203 of the substrate 102, a material layer sidewall 209, a plurality of first layer sidewalls 211, and a plurality of spacer sidewalls 213. In some embodiments, the spacer sidewalls 213 form the openings 302 instead a plurality of second layer sidewalls when the spacers 210 are not utilized.

It is generally beneficial to fill each of the openings 302 between the multi-material layers 205 with minimal voids or bubbles within the source/drain layers 215. Previous methods of forming source/drain layers 215 include growth of the source/drain layers 215 on the first layer sidewalls 211 as well as the top surface 203 of the substrate 102. However, this causes each of the individual portions of the source/drain layers 215 to grow and contact separately. Voids and bubbles are formed within the source/drain layers 215 in areas where the source/drain layer 215 growth restricted access to an area in which the source/drain layers 215 had not already been grown.

After the formation of the multi-material layers 205 on the substrate 102, another operation 404 is performed to deposit a boron doped silicon-germanium layer. The boron doped silicon-germanium layer is grown on surfaces with a <100> crystal growth direction within the openings 302. The <100> surfaces as described herein include the top surface 203 of the substrate 102. In embodiments described herein, the first layer sidewalls 211 have a <110> growth direction and the deposition rate of the boron doped silicon-germanium layer is greatly reduced on the first layer sidewalls 211 comparatively to the deposition rate on the top surface 203 of the substrate 102.

During the operation 404, a combination of precursors is introduced into a process chamber, such as the deposition chamber 100. The combination of precursors includes a first precursor containing silicon, a second precursor containing germanium, and a third precursor containing a p-type dopant. At least one of the first precursor, the second precursor, and the third precursor further includes chlorine. The first precursor may be any one or a combination of silane ($SiH_4$), disilane ($Si_2H_6$), chlorosilane ($SiH_3Cl$), dichlorosilane ($SiH_2Cl_2$), or trichlorosilane ($SiHCl_3$). The second precursor may be any one or a combination of germanium hydride (germane, $GeH_4$), digermane ($Ge_2H_6$), trigermane ($Ge_3H_8$), or germanium tetrachloride ($GeCl_4$). The third precursor may be any one or a combination of boron trichloride ($BCl_3$) or diborane ($B_2H_6$). In some embodiments, other precursors may be used as the third precursor which contain dopants other than boron, such as aluminum containing precursors or gallium containing precursors.

Figure 4:
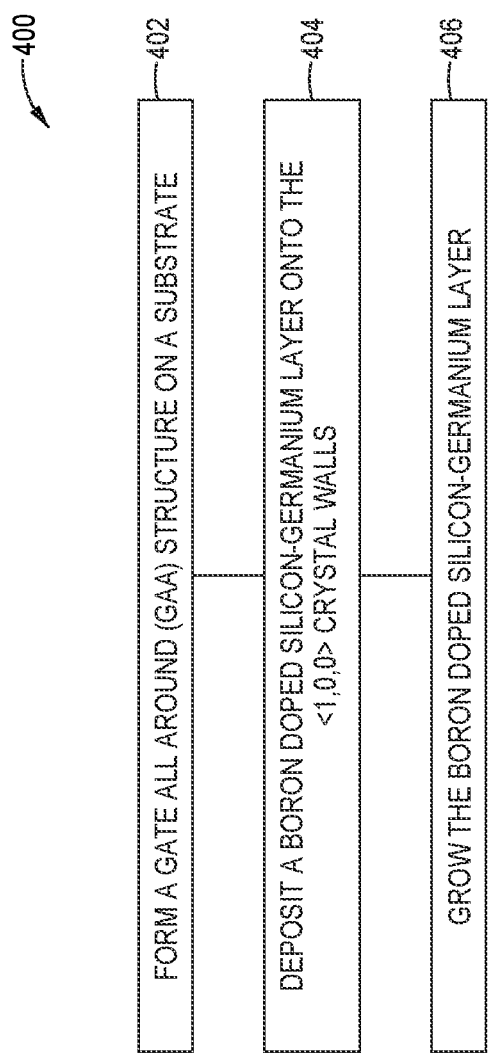
FIG. 4 illustrates a method of forming the hGAA structure of FIGS. 2 and 3A-3E, according to one embodiment.

FIG. 5 is a chart illustrating different combinations of precursors used within the method of FIG. 4. As described in FIG. 5, there is least one precursor containing silicon, one precursor containing germanium, and one precursor containing boron being flowed into the deposition chamber during the method 400. At least one of the precursors contains chlorine within the method 400 to assist in continuous etch back of the deposited layer. Each of the first precursor, the second precursor, and the third precursor may be co-flowed into the deposition chamber.

In one embodiment, the precursor mixture introduced into the deposition chamber to expose the substrate includes a first precursor containing dichlorosilane ($SiH_2Cl_2$), a second precursor containing germane ($GeH_4$), and a third precursor containing both diborane ($B_2H_6$) and boron trichloride ($BCl_3$) as in combination 1 of FIG. 5. In another embodiment, the precursor mixture introduced into the deposition chamber to expose the substrate includes a first precursor containing silane ($SiH_4$), a second precursor containing germane ($GeH_4$), and a third precursor containing both diborane ($B_2H_6$) and boron trichloride ($BCl_3$) as in combination 2 of FIG. 5. In another embodiment, the precursor mixture introduced into the deposition chamber to expose the substrate includes a first precursor containing silane ($SiH_4$), a second precursor containing germanium tetrachloride ($GeCl_4$), and a third precursor containing diborane ($B_2H_6$) as in combination 3 of FIG. 5. In another embodiment, the precursor mixture introduced into the deposition chamber to expose the substrate includes a first precursor containing silane ($SiH_4$), a second precursor containing both germanium tetrachloride ($GeCl_4$) and germane ($GeH_4$), and a third precursor containing boron trichloride ($BCl_3$) as in combination 4 of FIG. 5. In another embodiment, the precursor mixture introduced into the deposition chamber to expose the substrate includes a first precursor containing silane ($SiH_4$), a second precursor containing both germanium tetrachloride ($GeCl_4$) and germane ($GeH_4$), and a third precursor containing both diborane ($B_2H_6$) and boron trichloride ($BCl_3$) as in combination 5 of FIG. 5. In yet another embodiment, the precursor mixture introduced into the deposition chamber to expose the substrate includes a first precursor containing dichlorosilane ($SiH_2Cl_2$), a second precursor containing germanium tetrachloride ($GeCl_4$), and a third precursor containing both diborane ($B_2H_6$) and boron trichloride ($BCl_3$) as in combination 1 of FIG. 5. In another embodiment, the precursor mixture introduced into the deposition chamber to expose the substrate includes a first precursor containing silane ($SiH_4$), a second precursor containing germanium tetrachloride ($GeCl_4$), and a third precursor containing boron trichloride ($BCl_3$) as in combination 7 of FIG. 5. In another embodiment, the precursor mixture introduced into the deposition chamber to expose the substrate includes a first precursor containing silane ($SiH_4$), a second precursor containing germanium tetrachloride ($GeCl_4$), a third precursor containing both diborane ($B_2H_6$) and boron trichloride ($BCl_3$), and a fourth precursor of hydrogen chloride (HCl) as in combination 8 of FIG. 5.

In some embodiments, a hydrogen chloride (HCl) precursor may be introduced into the processing region as a mixture with any of the first precursor, the second precursor, or the third precursor and with any of the combinations of FIG. 5. Other precursor combinations are also contemplated, but not explicitly described herein. Inert gases, such as argon (Ar), helium (He), xenon (Xe), and neon (Ne) may be flown in combination with any of the precursors described herein, such as in combination with any one or more of the first precursor, the second precursor, or the third precursor.

Each of the precursor combinations described herein is configured to deposit a boron doped silicon-germanium layer as the source/drain layers 215 on the top surface 203 of the substrate 102. Each of the precursor combinations described herein have been found to have significantly greater growth on crystals with <100> surfaces than on crystals with <110> surfaces. In embodiments described herein, the ratio of the growth rate on surfaces with a growth plane in the <100> direction to the growth rate on surfaces with a growth plane in the <110> direction is greater than about 5:1, such as greater than about 8:1, such as greater than about 10:1, such as greater than about 20:1. As described herein, the top surface 203 of the substrate 102 has a <100> surface, while the first layers 206 have a <110> surface. Therefore, growth primarily occurs on the top surface 203 and not on the first layers 206, which reduces the number of boundary layers and voids within the source/drain layers 215.

During the operation 404, the temperature of the process volume 136 within the process chamber is maintained at about 450° C. to about 750° C., such as about 500° C. to about 600° C., such as about 550° C. to about 600° C. The substrate support 106 may further be maintained at a temperature of about 450° C. to about 750° C., such as about 500° C. to about 600° C., such as about 550° C. to about 600° C. The pressure within the process volume 136 is about 1 Torr to about 300 Torr during the operation 404, such as about 3 Torr to about 7 Torr, such as about 4 Torr to about 6 Torr. The temperature and pressure ranges described herein, when in combination with the above described precursors, have been found to enable highly selective film formation of the source/drain layers 215, such that the growth rates along <100> surfaces are greater than growth rates along <110> surfaces.

Each of the first precursor, the second precursor, and the third precursor, has a combination of inert gas and precursor gas. The inert gas to precursor gas ratio may vary within each of the first precursor, the second precursor, and the third precursor. Within the first precursor, the silicon containing compound forms about 20% to about 80% of the mass of the first precursor. Within the second precursor, the germanium containing compound forms about 20% to about 60% of the mass of the second precursor. Within the third precursor, the boron containing compound has a boron concentration of about $1 \cdot 10^{20}$ atoms/cm$^3$ to about $1 \cdot 10^{21}$ atoms/cm$^3$ of the third precursor. In embodiments described herein, increasing the chlorine concentration within any or a combination of the first precursor, the second precursor, and the third precursor has been shown to increase the selectivity of the deposited layers. Not to be bound by theory, it is believed increasing the chlorine concentration as a ratio of flow compared to silicon and/or germanium may increase the selectivity of the film formation by etching back any layer which begins to form on the <110> surfaces as it is formed. The continuous chlorine etch therefore prevents film growth in the <110> direction.

Flow rates of each of the gases within the precursors are controlled to enable increased selective growth on the <100> surface. In one embodiment, combination 7 of the precursors as described above is introduced at a silane to germane ratio of about 1:1 to about 1:3, such as about 1:1.5 to about 1:2.5, such as about 1:2. The ratio of the boron trichloride to germane is about 1:25 to about 1:45, such as about 1:30 to about 1:40. Similarly, the ratio of the boron trichloride to silane is about 1:10 to about 1:25, such as about 1:15 to about 1:20. Using the flow rates described herein for combination 7 along with the precursor concentrations described herein has been shown to improve the selectivity of film growth to be predominantly on the <100> surface with reduced growth on the <110> surfaces. The ratio of film growth on the <100> surface to the <110> surface when using combination 7 and the flow rates and concentrations described herein is greater than about 20:1, such that there is negligible film growth on the <110> surfaces. As described herein, the flow of boron trichloride has been shown to correlate with the selective formation of the film on the <100> surface, such that processes with higher concentrations of boron trichloride have increased selectivity. Decreased boron concentration within the process gas flow has also been shown to improve selective formation of films on the <100> surface.

In another embodiment, combination 8 of the precursors as described above is introduced at a silane to germane ratio of about 1:1 to about 1:3, such as about 1:1.5 to about 1:2.5, such as about 1:2. The ratio of the boron trichloride precursor to germane is about 1:15 to about 1:30, such as about 1:20 to about 1:25. The ratio of diborane to germane is about 1:25 to about 1:45, such as about 1:30 to about 1:40. Similarly, the ratio of the boron trichloride to silane is about 1:5 to about 1:15, such as about 1:10 to about 1:11. The ratio of boron trichloride to silane is about 1:10 to about 1:25, such as about 1:15 to about 1:20. The ratio of hydrogen chloride to silane is about 1:3 to about 1:1, such as about 1:2 to about 1:2.5. The ratio of hydrogen chloride to germane is about 1:3 to about 1:5, such as about 1:3 to about 1:4. Using the flow rates described herein for combination 8 along with the precursor concentrations described herein has been shown to improve the selectivity of film growth to be predominantly on the <100> surface with reduced growth on the <110> surfaces. The ratio of film growth on the <100> surface to the <110> surface when using combination 7 and the flow rates and concentrations described herein is greater than about 5:1, such that there is greatly reduced film growth on the <110> surfaces.

For all precursor combinations described above and in FIG. 5, the ratio of the flow rate of the first precursor to the flow rate of the second precursor is about 1:1 to about 1:3, such as about 1:1.5 to about 1:2.5, such as about 1:2. The flow rate ratios of the third precursor to the first precursor is about 1:5 to about 1:20. The flow rate ratio of the third precursor to the second precursor is about 1:10 to about 1:40. As described herein, the relative flow ratios of boron and chlorine into the processing volume at least partially control the selective deposition of the film. As described herein, a boron to chlorine ratio of about 1:10 to about 1:2, such as about 1:5 to about 1:2, such as about 1:5 to about 1:3 is utilized.

Figure 3A:
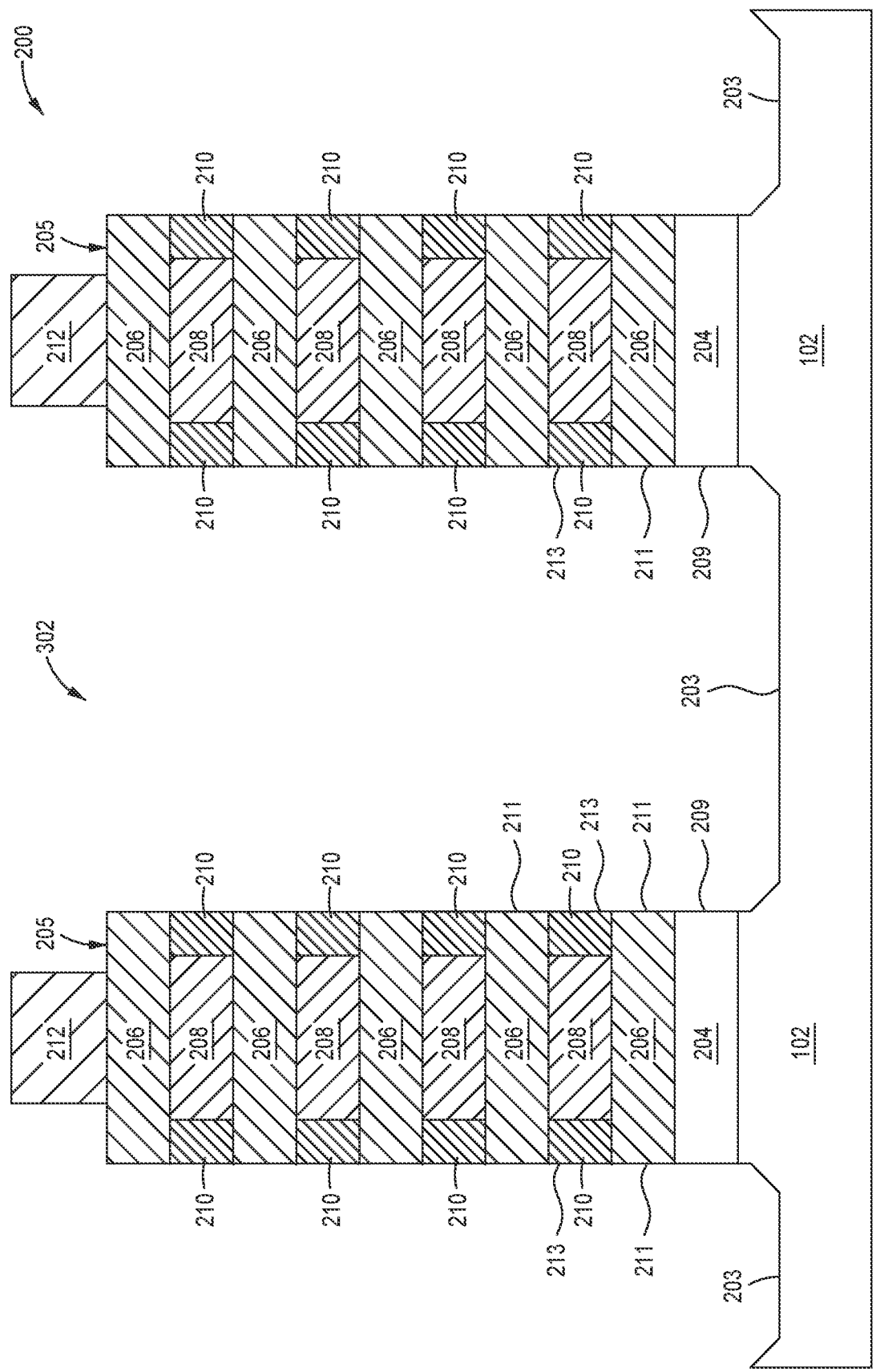
FIGS. 3A-3E illustrate a schematic cross-sectional view of the hGAA structure of FIG. 2, according to one embodiment.
Figure 3B:
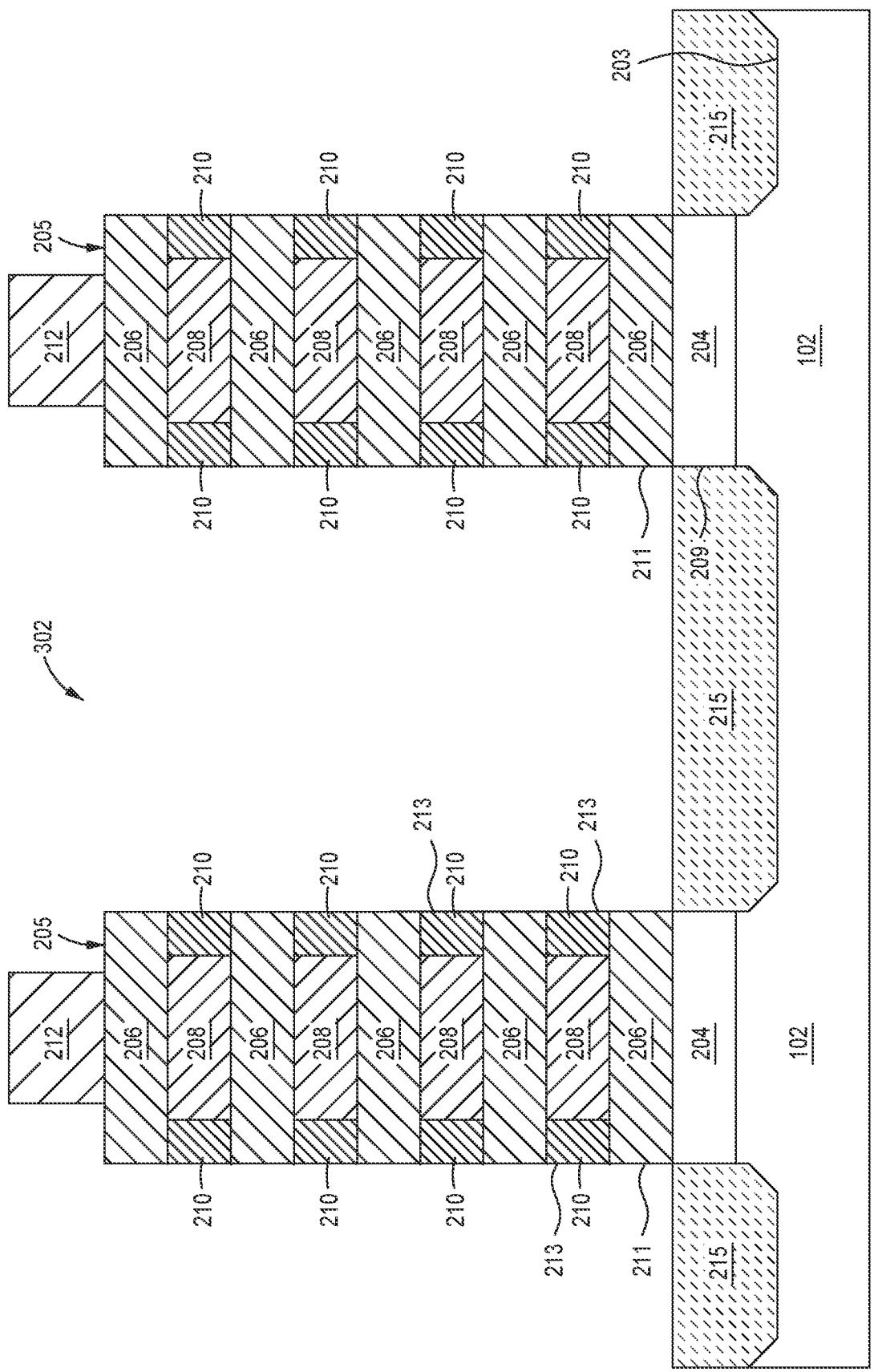

As shown in FIG. 3B, the source/drain layers 215 are grown during another operation 406. The growth during the operation 406 may be a continuation of the growth initiated during the operation 404. The source/drain layers 215 are grown from the top surface 203 of the substrate 102 and have either no growth along the first layer sidewalls 211 or a much smaller growth rate along the first layer sidewalls 211 than on the substrate 102. The source/drain layers 215 exhibit reduced faceting behavior, such that the source/drain layers 215 may exhibit no faceting behavior when using precursor combinations described herein. As shown in FIG. 3B, the source/drain layers 215 are disposed in contact with the material layer sidewall 209. While the source/drain layers 215 are not grown on the material layer sidewall 209, the reduced faceting and reduced void formation enables the source/drain layers 215 to grow along the material layer sidewall 209. The source/drain layers 215 exhibit good wetting behavior on the material layer sidewall 209.

Figure 3C:
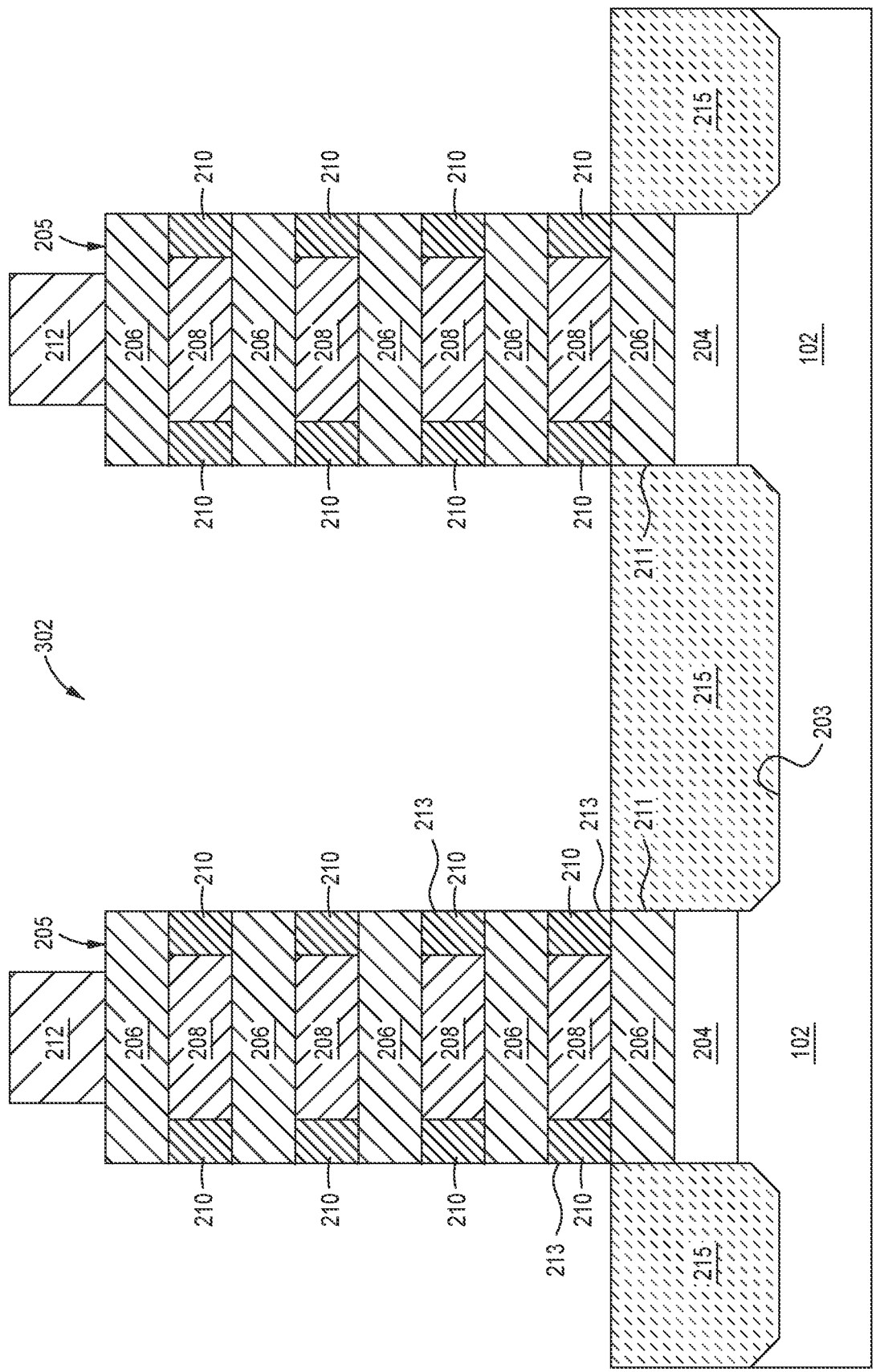

As shown in FIG. 3C, the source/drain layers 215 continue to grow without faceting to be in contact with a first set of the first layer sidewalls 211. The source/drain layers 215 may exhibit either reduced or no growth along the first layer sidewalls 211, but exhibit good wetting behavior on the first layer sidewalls 211, such that the source/drain layers 215 bond with the first layer sidewalls 211 without the formation of voids. The good wetting behavior assists in reducing the resistivity between the source/drain layers 215 and the first layers 206. The methods described herein exhibit a resistivity of less than about 0.3 mΩ·cm, such as less than about 0.25 mΩ·cm between the source/drain layers 215 and the first layers 206.

Figure 3D:
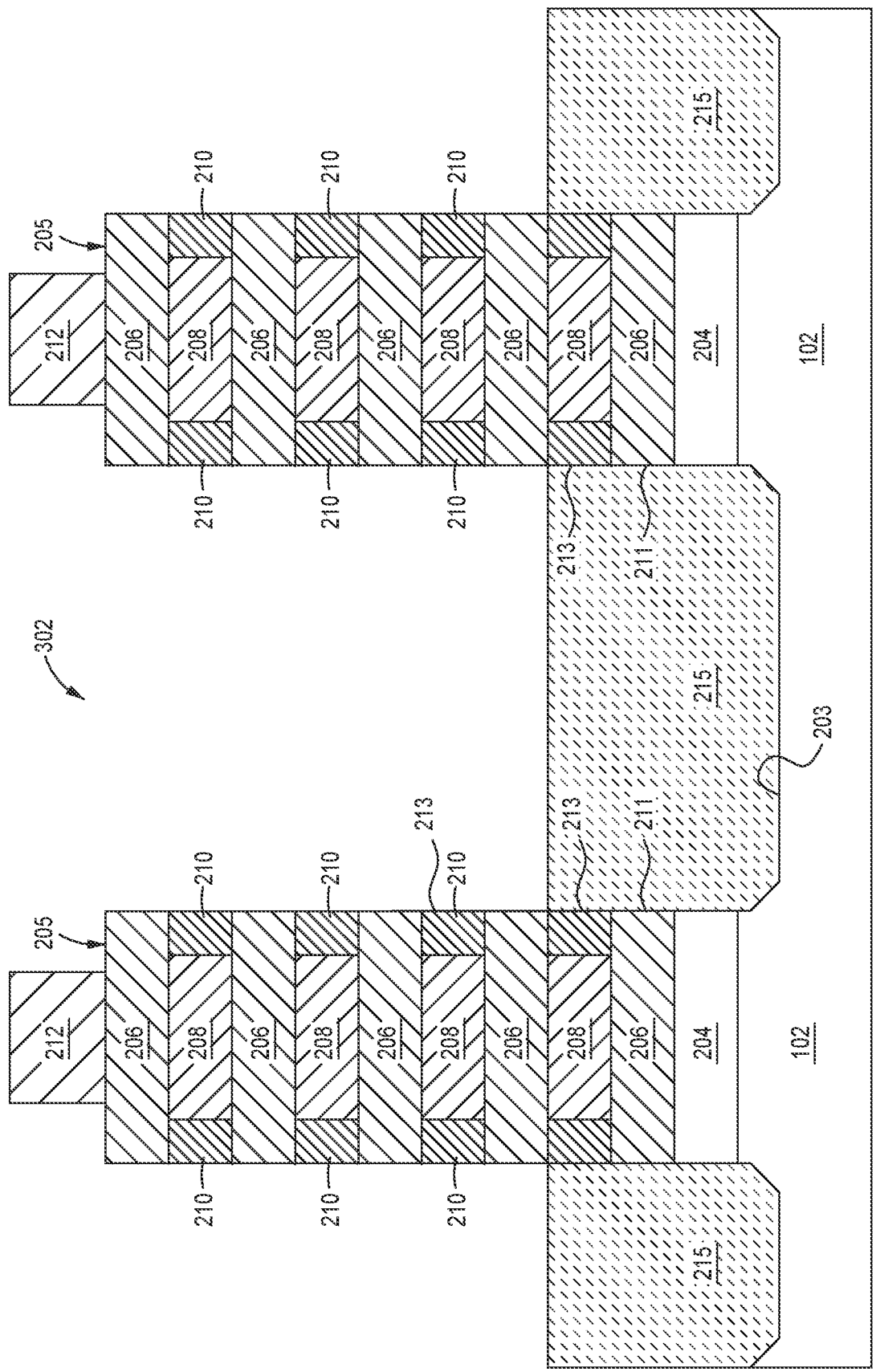
Figure 3E:
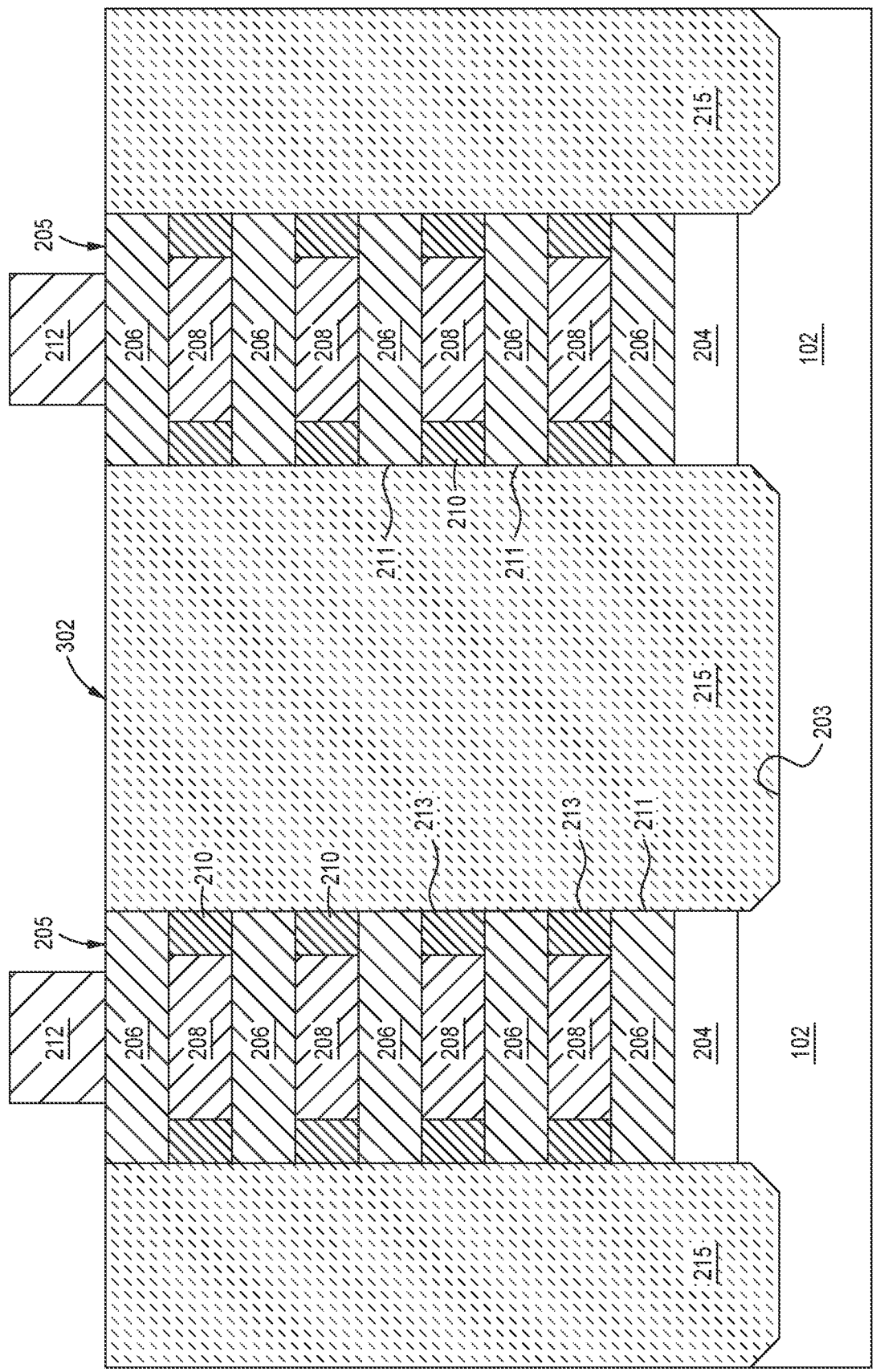

As shown in FIG. 3D, the source/drain layers 215 are grown to be in contact with the spacer sidewalls 213. The reduced faceting of the source/drain layers 215 enables improved contact with the spacer sidewalls 213, such that voids or gaps between the spacer sidewalls 213 and the source/drain layers are reduced. Reduced faceting and a single growth direction of the source/drain layers 215 enables the source/drain layers 215 to continue growing over each of the spacers 210 and to contact each of the first layer sidewalls 211 as shown in FIG. 3E. In FIG. 3E, the source/drain layers 215 are shown filling the entire opening 302.

The precursor combinations and ratios described herein enable selective growth on <100> oriented crystal surfaces, reduced faceting, and improved wetting with first layer sidewalls 211 of the multi-material layer 205. The selective growth, reduced faceting, and improved wetting reduce the quantity of voids within the source/drain layers 215 and enable low resistivity between the source/drain layers and the first layers 206.

While the foregoing is directed to embodiments of the present disclosure, other and further embodiments of the disclosure may be devised without departing from the basic scope thereof, and the scope thereof is determined by the claims that follow.

What is claimed is:

1. A method of forming a semiconductor device comprising:
   forming a multi-material layer on a substrate, wherein the multi-material layer includes a plurality of crystalline first layers and a plurality of non-crystalline second layers arranged in an alternating pattern;
   exposing the substrate and the multi-material layer to a gas mixture comprising:
      a first precursor containing silicon;
      a second precursor containing germanium; and
      a third precursor containing a p-type dopant, wherein the second precursor, the third precursor, or both the second precursor and the third precursor further comprises chlorine; and
   forming a source/drain layer on the substrate with predominantly <100> growth.

2. The method of claim 1, wherein exposing the substrate is performed at a temperature of about 450° C. to about 750° C.

3. The method of claim 2, wherein exposing the substrate is performed at a pressure of about 1 Torr to about 10 Torr.

4. The method of claim 1, wherein the first precursor includes one or a combination of silane, disilane, chlorosilane, dichlorosilane, or trichlorosilane.

5. The method of claim 1, wherein the second precursor includes one or a combination of germanium hydride, digermane, trigermane, or germanium tetrachloride.

6. The method of claim 1, wherein the third precursor includes one or a combination of boron trichloride or diborane.

7. The method of claim 1, wherein a top surface of the substrate has a primarily <100> growth direction and a growth rate of the source/drain layer on the top surface of the substrate is greater than 5 times the growth rate of the source/drain layer on either of the crystalline first layers or the non-crystalline second layers.

8. The method of claim 7, wherein a dielectric spacer is formed on outer ends of the non-crystalline second layers.

9. The method of claim 7, wherein a ratio of the first precursor to the second precursor is about 1:1 to about 1:3.

10. A method of forming a semiconductor device comprising:
    selectively growing a source region and a drain region on a substrate in a predominantly <100> direction, the selectively growing the source region and the drain region further comprising:
       exposing the substrate and a multi-material layer to a gas mixture comprising a first precursor containing silane, a second precursor containing germanium, and a third precursor containing a p-type dopant, wherein one or more of the second precursor or the third precursor further comprises chlorine.

11. The method of claim 10, wherein the multi-material layer is disposed on the substrate and the multi-material layer includes a plurality of crystalline first layers and a plurality of non-crystalline second layers arranged in an alternating pattern.

12. The method of claim 10, wherein exposing the substrate is performed at a temperature of about 450° C. and about 750° C. and a pressure of about 1 Torr to about 10 Torr.

13. The method of claim 10, wherein a ratio of a growth rate of the source region and the drain region on <100> surfaces to a growth rate of the source region and the drain region on <110> surfaces is greater than about 5:1.

14. The method of claim 10, wherein the third precursor is a boron containing precursor.

15. The method of claim 14, wherein a ratio of the first precursor to the second precursor is about 1:1 to about 1:3 and the ratio of the third precursor to the first precursor is about 1:5 to about 1:20.

16. The method of claim 15, wherein the second precursor includes one or a combination of germanium hydride, digermane, trigermane, or germanium tetrachloride.

17. The method of claim 10, wherein the substrate is disposed within an epitaxial deposition chamber during the exposing of the substrate.

18. A non-transitory computer-readable medium storing instructions that, when executed by a processor, cause a computer system to perform the steps of:
    exposing a substrate and a multi-material layer to a gas mixture comprising a first precursor containing silicon, a second precursor containing germanium, and a third precursor containing a p-type dopant, wherein one or more of the second precursor and the third precursor further comprises chlorine; and
    forming a source/drain layer on the substrate with predominantly <100> growth.

19. The medium of claim 18, wherein the first precursor comprises one or a combination of silane, disilane, chlorosilane, dichlorosilane, or trichlorosilane, the second precursor comprises one or a combination of germanium hydride, digermane, trigermane, or germanium tetrachloride, and the third precursor comprises one or a combination of boron trichloride or diborane.

20. The medium of claim 19, wherein a ratio of the first precursor to the second precursor is about 1:1 to about 1:3 and a ratio of the third precursor to the first precursor is about 1:5 to about 1:20.

* * * * *